US008673736B2

(12) United States Patent
Yang et al.

(10) Patent No.: US 8,673,736 B2
(45) Date of Patent: *Mar. 18, 2014

(54) METHOD OF FORMING SOI-LIKE STRUCTURE IN A BULK SEMICONDUCTOR SUBSTRATE BY ANNEALING A LOWER PORTION OF A TRENCH WHILE PROTECTING AN UPPER PORTION OF THE TRENCH

(75) Inventors: Ji-Yi Yang, Taoyuan (TW); Chien-Hao Chen, Ylian County (TW); Tze-Liang Lee, Hsinchu (TW); Shih-Chang Chen, Hsinchu (TW); Huan-Just Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1364 days.

This patent is subject to a terminal disclaimer.

(21) Appl. No.: 11/546,768

(22) Filed: Oct. 12, 2006

(65) Prior Publication Data
US 2007/0032037 A1   Feb. 8, 2007

Related U.S. Application Data

(63) Continuation of application No. 11/847,607, filed on May 17, 2004, now Pat. No. 7,157,350.

(51) Int. Cl.
*H01L 21/762*   (2006.01)

(52) U.S. Cl.
USPC ............... 438/426; 438/445; 438/E21.555

(58) Field of Classification Search
USPC .......... 438/243, 386, 421, 422, 424, 426, 445
See application file for complete search history.

(56) References Cited

U.S. PATENT DOCUMENTS

| | | | |
|---|---|---|---|
| 4,685,198 A * | 8/1987 | Kawakita et al. | 438/410 |
| 5,972,758 A * | 10/1999 | Liang | 438/294 |
| 6,100,132 A | 8/2000 | Sato et al. | |
| 6,232,202 B1 | 5/2001 | Hong | |
| 6,570,217 B1 | 5/2003 | Sato et al. | |
| 6,579,738 B2 | 6/2003 | Farrar et al. | |
| 6,630,714 B2 | 10/2003 | Sato et al. | |
| 6,746,933 B1 | 6/2004 | Beintner et al. | |
| 6,841,452 B2 * | 1/2005 | Tanaka | 438/424 |
| 7,045,382 B2 * | 5/2006 | Benzel et al. | 438/50 |
| 2003/0173617 A1 | 9/2003 | Sato et al. | |
| 2003/0190766 A1* | 10/2003 | Gonzalez et al. | 438/57 |

OTHER PUBLICATIONS

Goodwins, R., "Toshiba Finds 'Nothing' Makes a Better Transistor," http://news.zdnet.co.uk/hardware/chips/0.39020354.2100428,00. html, Dec. 5, 2001, 1 pg.
Patch, K., "Silicon Process Produces Pockets," *Technology Research News*, Dec. 20/27, 2000, at http://www.trnmag.com/Stories/122000/silicon_process_produces_pockets_122000.html, 2 pgs.

(Continued)

*Primary Examiner* — Anh Mai
(74) *Attorney, Agent, or Firm* — Slater & Matsil, L.L.P.

(57) ABSTRACT

Bulk silicon is transformed into an SOI-like structure by annealing. Trenches are formed in a bulk substrate to define device sites. The lower portions of the trenches are annealed at low pressure in a hydrogen atmosphere. This transforms the lower trench portions to expanded, spheroidal voids that extend under the device sites. Neighboring voids each reside about half way under an intervening site. A silicon-consuming process forms a liner on the walls of the voids, with the liners on neighboring voids abutting to isolate the intervening device site from the substrate and other device sites.

12 Claims, 5 Drawing Sheets

(56) References Cited

OTHER PUBLICATIONS

Mizushima, I., et al., "Empty-Space-In-Silicon Technique for Fabricating a Silicon-On-Nothing Structure," Applied Physics Letters, vol. 77, No. 20, Nov. 13, 2000, pp. 3290-3292.

Horita, K., et al., "Advanced Shallow Trench Isolation to Suppress the Inverse Narrow Channel Effects for 0.24 μn Pitch Isolation and Beyond," 2000 Symposium on VLSI Technology Digest of Technical Papers, pp. 178-179.

Ogura, T., et al., "A Shallow Trench Isolation with SiN Guard-Ring for Sub-Quarter Micron CMOS Technologies," 1998 Symposium on VLSI Technology Digest of Technical Papers, pp. 210-211.

Mizushima, I., et al., "Formation of SON (Silicon on Nothing) Structure Using Surface Migration of Silicon Atoms," http://www.jsap.or.jp/ap/2000/ob6910/p691187.html, Oyo Buturi, vol. 69, No. 10, pp. 1187-1191.

Sato, T., et al., "A New Substrate Engineering for the Formation of Empty Space in Silicon (ESS) Induced by Silicon Surface Migration," IEDM, 1999, pp. 517-520.

\* cited by examiner

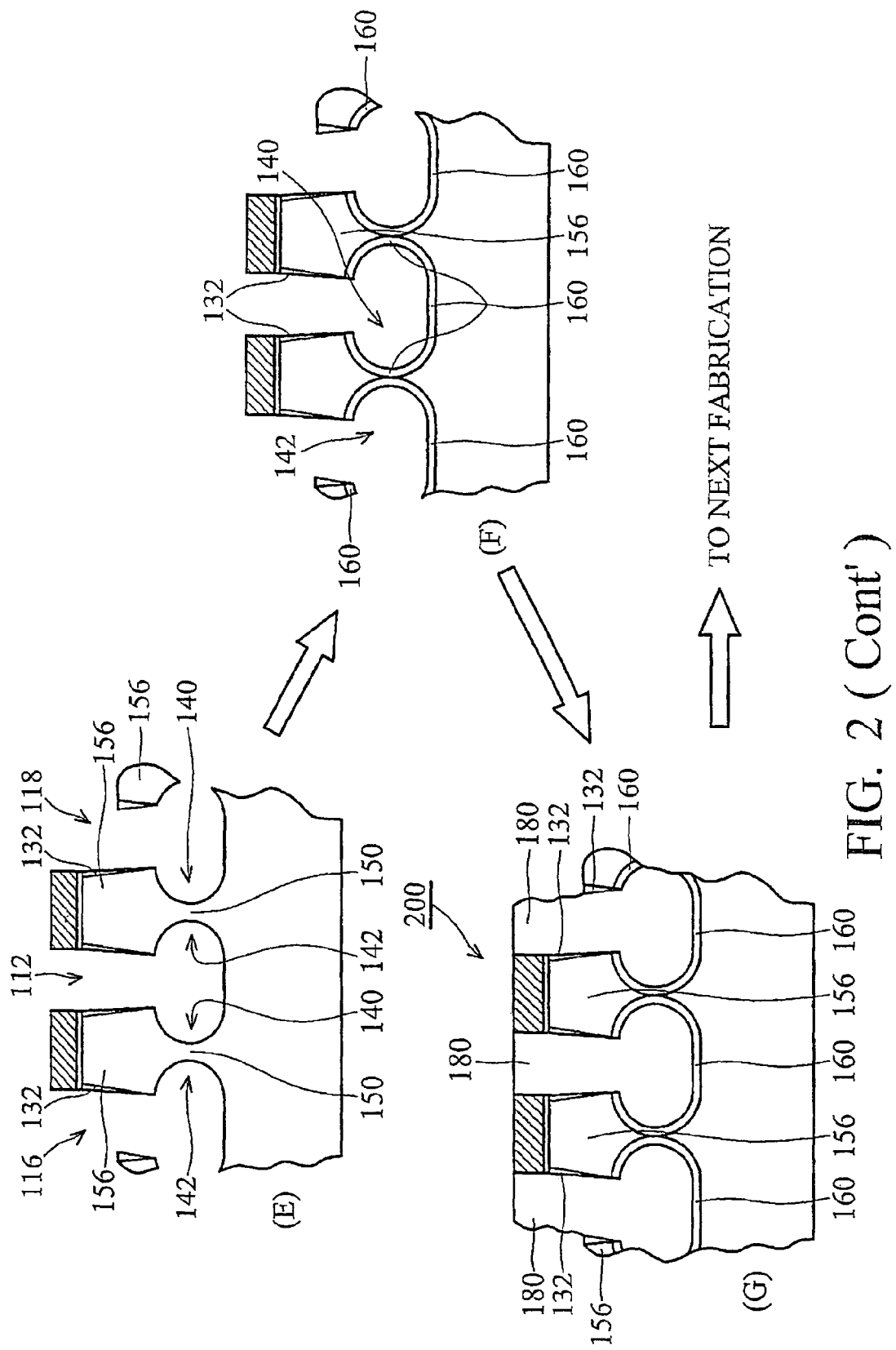
FIG. 2 (Cont')

METHOD OF FORMING SOI-LIKE STRUCTURE IN A BULK SEMICONDUCTOR SUBSTRATE BY ANNEALING A LOWER PORTION OF A TRENCH WHILE PROTECTING AN UPPER PORTION OF THE TRENCH

This application is a continuation of U.S. patent application Ser. No. 10/847,607, filed on May 17, 2004, now U.S. Pat. No. 7,157,350 entitled "Method of Forming SOI-Like Structure In A Bulk Semiconductor Substrate Using Self-Organized Atomic Migration," which application is hereby incorporated herein by reference.

TECHNICAL FIELD

The present invention relates an SOI-like structure formed in a bulk semiconductor substrate and to a method of forming the structure. More particularly, the present invention relates to such a structure and to a method of forming it so that it is capable of acting as a semiconductor device site, the device site having characteristics that approach, or are the equivalent of, SOI device sites.

BACKGROUND

The fabrication of semiconductor devices according to various bulk and SOI protocols is known. In the former, neighboring devices are mutually isolated by intervening deep trenches that are filled with an insulative or dielectric material. Typically, if the bulk material is silicon, the trenches are filled with silicon oxide. In following SOI protocols, a thin layer of a semiconductor is formed on an insulative material. Thereafter, shallow trenches are formed through the semiconductor layer, typically silicon, and are filled with an insulative material, typically silicon oxide.

The major advantage of a bulk substrate over an SOI substrate is that the bulk substrate is substantially less expensive. However, certain devices, such as field effect transistors (FETs), fabricated on and in SOI substrates have several operational advantages over devices fabricated on and in bulk substrates.

It is known that the source/drain-to-substrate junction capacitance of an FET fabricated according to SOI protocols is lower than the source/drain-to-substrate junction capacitance of an FET formed in a bulk-silicon substrate. Further, SOI techniques allow drain current to be significantly higher at low voltages. Thus, as compared to bulk-silicon FETs, FETs fabricated pursuant to SOI protocols exhibit higher speeds (about 20%-35% or more), if both are operated at the same voltage, and reduced power consumption (about 35%-70% or more), if both are operated to give the same speed performance.

Moreover, latchup is eliminated in SOI FETs, which, in conjunction with the ability to retain low intra-well and inter-well leakage currents due to dielectric isolation, permits reduction in isolation spacing design rules, thus permitting increased packing density. Additional advantages of SOI devices with respect to bulk devices include: reduced soft error sensitivity, improved turn-on characteristic, reduced leakage current, and improved reliability by eliminating junction spiking.

There has recently emerged a so-called silicon-on-nothing ("SON") technology, sometimes referred to as empty-space-in-silicon ("ESS"). See, for example, U.S. Pat. Nos. 6,630,714 to Sato et al. ("'714 patent") and 6,579,738 to Farrar, et al. ("'738 patent"), and U.S. Published application 20030173617 to Sato, et al. ("'617 published application"); "Toshiba Finds 'Nothing' Makes a Better Transistor," by Goodwins, 12/5/01, at http://news.zdnet.co.uk/hardware/chips/0.39020354,2100428.00.html ("Goodwins"); *Oyo Buturi* [a monthly publication of the Japan Society of Applied Physics], Vol. 69, No. 10, pp. 1187-1191, circa 2000, "Formation of SON (Silicon on Nothing) Structure Using Surface Migration of Silicon Atoms," by Sato et al. at http://www.jsap.or.ip/ap/2000/ob6910/p691187.html ("Sato"); "Silicon Process Produces Pockets," by Patch, in *Technology Research News*, Dec. 20/27, 2000, at http://www.tnrnag.com/122000/silicon_process_produces_pockets_122000.html ("Patch"); and "Empty-Space-In-Silicon Technique for Fabricating a Silicon-On-Nothing Structure," by Mizushima, et al., in *Applied Physics Letters*, Vol. 77, No. 20, Nov. 13, 2000, pp. 3290-3292 ("Mizushima").

The '714 patent discloses an FET formed on a thin silicon layer closing the open top of a cavity formed in a silicon substrate, the sides of the source and drain of the FET abutting STI. Neither the method of forming the cavity nor the method of closing the cavity with the thin semiconductor layer are disclosed.

The '738 patent discloses a method of forming a closed, isolated cavity within a silicon body. A cylindrical hole is formed in the substrate. Thereafter, the substrate is annealed in a deoxidizing ambient, such as hydrogen gas (pressure about 10 torr) at a high temperature (about 1100° C.) to effect self-organized migration of silicon atoms on the surfaces (wall and bottom) of the hole (a description of which effect is attributed to Sato et al., in "Substrate Engineering for the Formation of Empty Space in Silicon Induced by Silicon Surface Migration," in 1999 IEDM Digest, paper 20.6.1). During annealing the silicon atoms migrate so that their surface energy is minimized. After about one minute, the shape and morphology of the hole changes drastically to that of a sphere-shaped void within the substrate. The hole first closes, then vanishes. A line or matrix of such holes may be similarly treated to form, respectively, a pipe-like void or a plate-like void within the substrate. One or more interconnect holes are then formed in the substrate to intersect the buried void. The interconnect hole and the void are then filled with a selected conductive material.

The '617 published application discloses a method of forming an isolated, closed void in a silicon substrate to achieve benefits like those achieved by SOI. The void ultimately resides beneath the channel of an MOS transistor. The method involves forming a groove having an aspect ratio greater than a critical value in the surface of the substrate and then subjecting the substrate to annealing like that of the '738 patent, except that the annealing time is said to be 10 minutes. This annealing "clos[es] the open portion of the groove . . . to thereby form a cavity." Indeed, according to the '617 published application, "The important thing with the cavity . . . is that the open portion of the groove with a high aspect ratio is closed by performing a high-temperature annealing to change the groove into a cavity."

Mizushima, apparently describing the work leading to the '617 application, is to the same effect as the '617 application. Annealing, as in the '617 application, is performed to close a trench or hole formed in a silicon substrate to form a closed void or cavity within the substrate. Mizushima notes that, "[I]n the case of . . . trenches . . . each trench broke up to a spherical empty space or spaces."

Referring to FIG. 1, the '738 patent, the '617 published application, and Mizushima illustrate that, as a silicon substrate 10 having a hole 12 formed therein, FIG. 1(A), is subjected to annealing, the lower portion of the hole 12 first begins to round and the upper wall portions of the hole or trench begin to close, FIGS. 1(B)-1(D). Further rounding of the lower portion and closing of the upper wall portion of the hole 12 continue as annealing continues, FIG. 1(E). Then, a spheroidal void 14 begins to form, FIGS. 1(D) through 1(F), as the superjacent portion of the hole 12 continues to shrink, FIG. 1(D), closes or pinches off, FIG. 1(E), and becomes discontinuous from the void 14, FIG. 1(F). The hole 12 continues to shrink and closes above the void 14, FIG. 1(G). Finally, the hole 12 disappears, leaving only the void, FIG. 1(H). If a line of holes 12 are formed sufficiently close together, their voids 14 merge to form a pipe-like void (not shown). If a matrix of holes 12 is formed sufficiently close together, their voids 14 merge to form a plate-like void (not shown).

SUMMARY OF THE INVENTION

Still referring to FIG. 1, the present method utilizes the phenomenon of the above-described, prior art void-forming procedure, effectively interrupting that procedure, however, at or immediately after the state depicted in FIG. 1(D), without reaching the states shown in FIGS. 1(E)-1(H).

Specifically, the present invention contemplates a method of fabricating a device, such as an FET or other transistor, in relatively inexpensive bulk silicon. By implementing the method of the present invention, the device possesses SOI-like properties and characteristics. This is achieved by terminating the annealing and consequent self-organized migration of silicon atoms from the walls of a trench, after the lower portions of the trench are transformed into an expanded spherical configuration but before the upper walls of the trench close. That is, the upper trench portion remains open after annealing and is in communication with the rounded or spherical partial void that forms where the bottom portions of the trench formerly resided. The remaining trench portion and the spherical void are ultimately filled with an insulative material.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
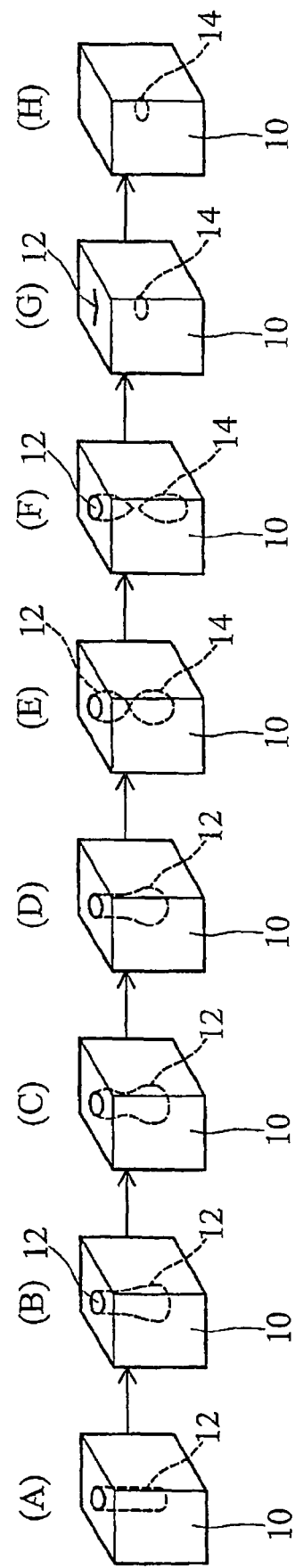
FIG. 1 contains FIGS. 1(A) through 1(H), which schematically illustrate the state of the prior art discussed above.

The present invention is directed to a method of fabricating an SOI-like structure in a bulk semiconductor substrate 100. The structure may be used in the fabrication of a device, such as an FET, or any other device or element which is improved by SOI fabrication. Although in described embodiments the substrate 100 is silicon, bulk semiconductor substrates 100 of other materials are also contemplated. Specifically, the present method contemplates any substrate material which, like silicon, exhibits self-organized migration of its surface atoms in an appropriate ambient, which ambient is not inimical to later FET or other device fabrication.

FIG. 2(A) shows the bulk substrate 100. Formed on the generally planar free surface 102 of the substrate 100 is a pad layer 104 which may comprise an oxide layer and a nitride layer, both formed by conventional methods. A photoresist layer 106 is conventionally formed on the pad layer 104 and is exposed and developed leaving a mask 106 defining openings 108, see FIG. 2(B). The pad layer 104 and the substrate 100 are then conventionally selectively etched to form sites 110A and 110B on and in each of which an FET or other device will be fabricated, FIG. 2(B).

In FIG. 2(B), there are shown two adjacent sites 110A and 110B on each of which an FET is to be fabricated. The sites 110A and 110B are defined, in part, by an intervening trench 112 produced by the site-forming etching. The sites 110A and 110B are also defined by trenches 116 and 118 which are formed in the substrate 100 simultaneously with the trench 112. The trenches 116 and 118, in turn, partly define other FET sites (not shown) to the left and right, respectively, of the sites 110A and 110B. The trenches have side walls 120 and 122 and a bottom wall 124. The side walls 120 and 122 define the sides of the sites 110A and 110B Each site 110A and 110B includes a generally planar top surface 102 that was formerly an area of the free surface 102 of the substrate 100 and, after trench-etching, carries a portion of the pad layer 104 underlying a portion of the photoresist layer 106. An FET or other device will be formed on and below each top surface 102 of the sites 110A and 110B.

Figure 2:
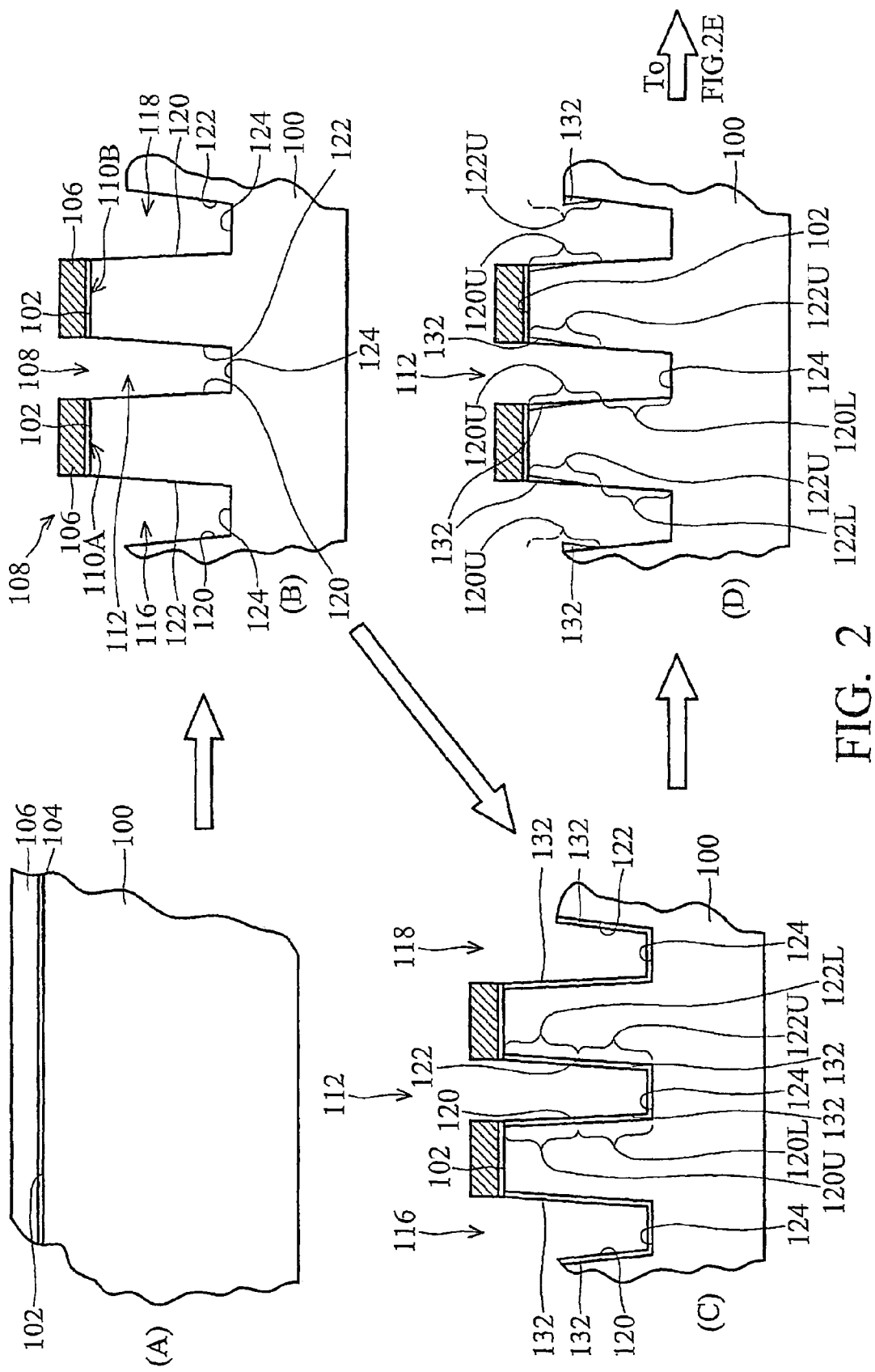
FIG. 2 contains FIGS. 2(A) through 2(G), which illustrate a bulk silicon structure from which a device having SOI-like characteristics may be fabricated according to SOI protocols and steps of a method for making such a structure, both as contemplated by the present invention.

Although not shown in FIG. 2, between FIGS. 2(A) and 2(B), the walls 120, 122 and 124 of the trenches 112, 116, and 118 may have a conventional sacrificial oxide first deposited thereon and then removed therefrom to render the walls 120, 122 and 124 clean and to round the top corners of the sites 110A and 110B, as is known. If the substrate 100 is silicon, the sacrificial oxide may be $SiO_2$ thermally formed in a conventional manner in an oxygen-containing gas atmosphere. The gas may be $O_2$, $O_2+H_2$, $O_2+NH_3$, $O_2+N_2$, or other suitable gas. If desired, a layer of $Si_3N_4$ may be formed on the sacrificial oxide before its removal, for stress relief purposes.

A first liner 132, which may be silicon oxide, is then formed on the walls 120, 122 and 124 of the trenches 112, 116 and 118, FIG. 2(C). The first liner 132 may be formed by a conventional dry thermal process in a manner similar to the sacrificial oxide. Then, as shown in FIG. 2(D), the first liner 132 on the bottom wall 124 and on only lower portions 120L and 122L of the walls 120 and 122 of the trenches 112, 116 and 118 is removed. Such removal, which exposes the lower wall portions 120L and 122L and the bottom wall 124, may be effected by a conventional dry etch or an equivalent technique. During dry etching, the top corners of the sites 110A and 110B are protected from erosion by the pad layer 104 and the upper portions of the liner 132. The first liner 132 remains on upper portions 120U and 122U of the walls 120 and 122. Removal of the first liner 132 from only the lower wall portions 120L and 122L and from the bottom wall 124 may be achieved by a conventional mask-and-dry etch technique or its equivalent. After removing the first liner 132 from the wall surfaces of the trenches 112, 116 and 118—except for the upper wall portions 120U and 122U—the mask, if used, is removed.

As shown in FIG. 2(E), the bulk silicon substrate 100 is then subjected to low pressure (about 10 torr) annealing (at about 800°-950° C.) in hydrogen gas to achieve self-organized migration of the silicon atoms, the phenomenon described above with respect to the prior art. Self-organized migration of the silicon atoms transforms the exposed wall surfaces 120L, 122L and 124 of the trenches 112, 116 and 118, similar to the transformation shown in FIGS. 1(A) through 1(D). The surfaces affected by this migration are those surfaces 120L, 122L and 124 not covered by the remaining liner 132 or the layers 104 and 106.

Referring to FIG. 2(E), as annealing proceeds, the lower portions of the trenches 112, 116 and 118 defined by the surfaces 120L, 122L and 124 first begin to assume rounded configurations as they expand outwardly and downwardly, as in FIGS. 1(B) through 1(E), forming opposed voids or open volumes 140 and 142, the former being partly under one site 110A and the latter being partly under the adjacent site 110B. Annealing proceeds until each opposed void volume 140 and 142 resides beneath about one-half of its associated site, 110A and 110B. When and as this point is reached, and before the voids 140 and 142 close, as occurs in FIG. 1(E), annealing and migration are terminated.

Still referring to FIG. 2(E), the upper portion of each trench 112, 116 and 118, defined by the wall surfaces 120U and 122U, communicates with the combined opposed void volume 140+142. Beneath each site 110A and 110B are respective neighboring void volumes 142 and 140 that result from the transformation of the lower surfaces 120L, 122L and 124 of the trenches 116 and 118 to the left and right of the trench 112. In FIG. 2(E), the neighboring voids 142 and 140 (from left to right) under each site 110A and 110B are shown as being separated by a narrow region 150 comprising the remaining silicon of the substrate 100 under the sites 110A and 110B. Accordingly, each site 110A and 110B may be viewed as residing on a quasi-island 156 of silicon.

In FIG. 2(F), a second liner 160 is formed on the wall of each opposed void volume 140+142. The second liner 160 may be formed similarly to the formation of the first liner 132 or by another conventional technique which consumes silicon as it forms the second liner 160 with a volume greater than the volume of the consumed silicon. Preferably, the formation of the second liner 160 is carried out so that the second liners 160 on the walls of adjacent void volumes 142 and 140 beneath a given site 110 abut, as in FIG. 2(F), or very nearly abut, as in FIG. 3. Appropriate control of the annealing-migration process will achieve a desired spacing, or lack of spacing, between the second liners 160 on the walls of neighboring voids 142 and 140 under a site 110. As will be appreciated, such abutment or near abutment effectively electrically isolates each silicon island 156 bearing a site 110 from the remainder of the silicon substrate 100 and from neighboring sites 110.

Figure 3:
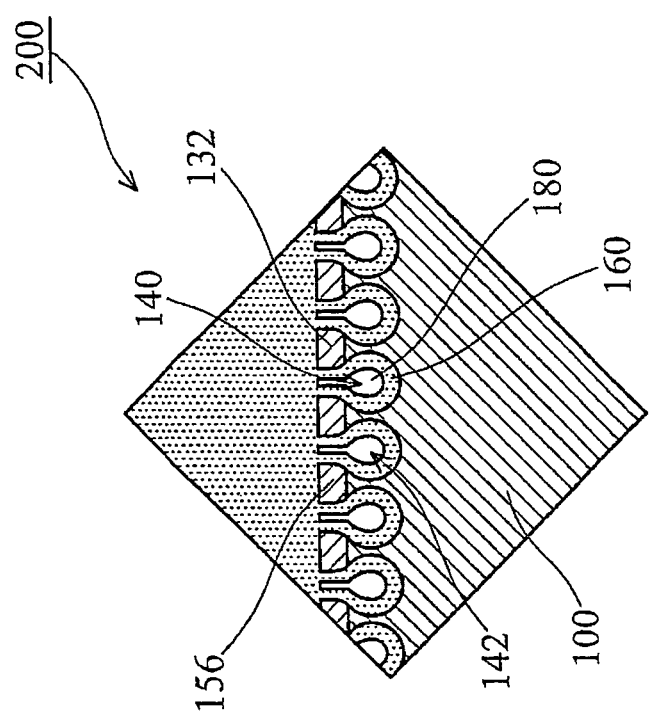
FIG. 3 is a photomicrograph of the SOI-like structures of FIG. 2 fabricated on and in bulk silicon according to the method of FIG. 2.

Referring to FIGS. 2(G) and 3, the upper portions of the trenches 112, 116 and 118 defined by the upper wall portions 120U and 122U covered with the second liner 160 and the interiors of the void volumes 140 and 142 are then filled with a suitable insulative material 180, such as silicon oxide. This is preferably achieved by HDP or an equivalent process capable of filling small gaps and spaces. There is thus formed an SOI-like structure 200 fabricated from a bulk silicon substrate 100.

Figure 4:
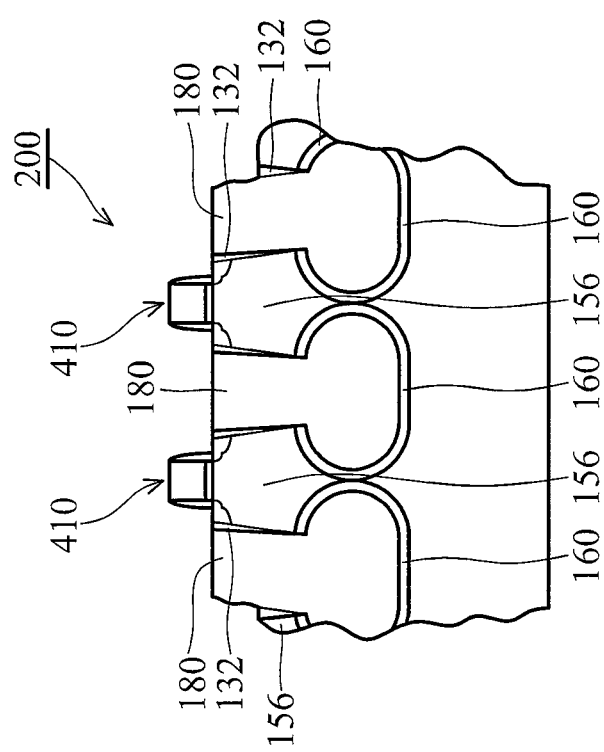
FIG. 4 illustrates a field-effect transistor formed on a silicon island in accordance with an embodiment of the present invention.

Following fabrication of the SOI-like structure 200, the structure 200 may be planarized by CMP or other functionally equivalent process to remove the layers 104 and 106 and the upper portions of the material 180. Thereafter, conventional fabrication methods may be employed to form FETs or other devices on and in the surfaces 102 of the silicon islands 156. For example, FIG. 4 illustrates an embodiment in which FETs 410 are formed on the silicon islands 156.

It has been found that the filled trench-void combinations 112-140-142, 116-140-142, etc., in the relatively inexpensive bulk substrate 100 are analogous and functionally equivalent to STI structures using a relatively expensive SOI substrate. The new steps added to traditional bulk substrate processing are the formation of the liner 132 (a step performed in conventional SOI processing); the removal of the liner 132 from the lower surfaces 120L, 122L and 124 of the trenches 112, 116 and 118; and the annealing-migration process to form the voids 140 and 142.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating an SOI-like structure in a bulk semiconductor substrate, the method comprising:
    forming a trench in the substrate, a wall of the trench defining a side of a device site and having an upper wall portion extending downwardly from a free surface of the substrate and a lower wall portion extending upwardly from a bottom of the trench;
    protecting the upper wall portion such that the lower wall portion is exposed;
    treating, after the protecting, the lower wall portion to transform a lower portion of the trench into a void communicating with an upper portion of the trench and extending directly under the device site; and
    forming an isolation region in the trench by at least in part filling the trench with insulative material extending between opposing sidewalls of the trench.

2. The method of claim 1, further comprising fabricating a semiconductor device in and on the device site.

3. The method of claim 1, wherein the treating step is effected by below atmospheric pressure annealing in a hydrogen atmosphere.

4. The method of claim 3, wherein annealing is effected at a pressure of about 10 torr and at a temperature ranging from about 800° C. to about 950° C.

5. A method of fabricating an SOI-like structure in a bulk semiconductor substrate, the structure being capable of acting as a semiconductor device site, atoms of the substrate being capable of self-organized migration when the substrate is exposed to a heated deoxidizing atmosphere, the method comprising:

forming two trenches in the substrate, one wall of each trench defining respective sides of a device site, each side-defining wall having an upper wall portion extending downwardly from a free surface of the substrate and a lower wall portion extending upwardly from a bottom of the trench;

annealing in the heated deoxidizing atmosphere and thereby effecting self-organized migration of the atoms in the respective lower wall portions to enlarge the respective lower wall portions into neighboring voids communicating with an upper portion of their respective trench and extending under the device site, while protecting the respective upper wall portions to minimize self-organized migration of atoms during the annealing step; and forming an insulative material in each of the trenches such that materials extending between opposing sidewalls of each trench are non-conductive.

6. The method of claim 5, wherein each void extends under approximately one-half of the device site.

7. The method of claim 5, further comprising fabricating a semiconductor device in and on the device site.

8. A method of fabricating an SOI-like structure in a bulk semiconductor substrate, the structure being capable of acting as a semiconductor device site, atoms of the substrate being capable of self-organized migration when the substrate is exposed to a heated deoxidizing atmosphere, the method comprising:

forming a trench in the substrate, a first wall of the trench defining a side of a first device site and a second wall of the trench defining a side of a second device site, each of the first wall and the second wall having an upper wall portion extending downwardly from a free surface of the substrate and a lower wall portion extending upwardly from a bottom of the trench;

annealing the lower wall portions in the heated deoxidizing atmosphere and thereby effecting self-organized migration of the atoms in the lower wall portions thereof to transform the lower wall portions into a void communicating with an upper portion of the trench and extending laterally under the first and second device sites, while preventing self-organized migration of the atoms in the upper wall portions; and filling the trench with electrically insulative material, thereby forming a non-conductive isolation trench between the first device site and the second device site.

9. The method of claim 8, further comprising fabricating a semiconductor device in and on the first device site.

10. The method of claim 8, wherein annealing is effected in a hydrogen atmosphere.

11. The method of claim 10, wherein an annealing temperature ranges from about 800° C. to about 950° C.

12. The method of claim 11, wherein annealing is effected at a pressure of about 10 torr.

* * * * *

UNITED STATES PATENT AND TRADEMARK OFFICE
CERTIFICATE OF CORRECTION

PATENT NO. : 8,673,736 B2  Page 1 of 1
APPLICATION NO. : 11/546768
DATED : March 18, 2014
INVENTOR(S) : Ji-Yi Yang It is certified that error appears in the above-identified patent and that said Letters Patent is hereby corrected as shown below:

On the Title Page, Item (63) Related U.S. Application Data, line 1, delete "application No. 11/847,607," and insert --application No. 10/847,607,--.

Signed and Sealed this
Tenth Day of June, 2014

Michelle K. Lee
*Deputy Director of the United States Patent and Trademark Office*